United States Patent [19]

Ohya et al.

[11] Patent Number: 4,651,046
[45] Date of Patent: Mar. 17, 1987

[54] PIEZOELECTRIC SCANNING DEVICE

[75] Inventors: Kanji Ohya; Naomasa Wakita; Yasuhiko Nakagawa, all of Aichi, Japan

[73] Assignee: NGK Spark Plug Co., Ltd., Nagoya, Japan

[21] Appl. No.: 786,476

[22] Filed: Oct. 11, 1985

[30] Foreign Application Priority Data

Oct. 15, 1984 [JP] Japan .............................. 59-155195[U]

[51] Int. Cl.⁴ ............................................. H01L 41/08
[52] U.S. Cl. .................................................... 310/328
[58] Field of Search ......................................... 310/328

[56] References Cited

U.S. PATENT DOCUMENTS 3,377,489  4/1968  Brisbane .............................. 310/328
3,684,904  8/1972  Galotva ............................... 310/328
4,163,168  7/1979  Ishikawa .............................. 310/328
4,455,501  6/1984  Tojo et al. ........................... 310/328

FOREIGN PATENT DOCUMENTS 55-100059  7/1980  Japan .
0752560    7/1980  U.S.S.R. ............................. 310/328

Primary Examiner—Mark O. Budd
Attorney, Agent, or Firm—Finnegan, Henderson, Farabow, Garrett & Dunner

[57] ABSTRACT

A piezoelectric scanning device comprises X-direction and Y-direction piezoelectric drive sections coupled to mutually perpendicular Z-direction piezoelectric clamping members. The selective application of voltages to the piezoelectric elements included in the X-direction and Y-direction drive sections and the Z-direction clamping members enables movement of the scanning device in two directions.

3 Claims, 4 Drawing Figures

PIEZOELECTRIC SCANNING DEVICE

FIELD OF THE INVENTION

This invention relates to a piezoelectric scanning device made from piezoelectric laminates that expand in the direction of lamination upon the application of a voltage.

BACKGROUND OF THE INVENTION

Japanese Laid-Open Patent Application No. 100059/1980 describes a piezoelectric scanning device wherein the ends of an elongated piezoelectric laminate are connected to tranversely extending clamping piezoelectric stacks to form a device in the shape of the letter "H." The elongated laminate steps upon the application of a voltage and generates measurable compression forces in the end pieces. Such a device, however, is limited in its applications because it may move only in a single direction.

OBJECTS AND SUMMARY OF THE INVENTION

An object of the present invention is a two-dimensional piezoelectric scanning device.

Another object of the present invention is a piezoelectric scanning device for movement in two orthogonal directions; and A further object of the present invention is a piezoelectric scanning device that is compact and accurate.

These and other objects are attained by a piezoelectric scanning device comprising a X-direction drive section including a plurality of first elongated piezoelectric stack means extending in a X-direction, each of said first elongated piezoelectric lamination means having a first end and a second end, a Y-direction drive section including a plurality of second elongated piezoelectric stack means extending in a Y-direction perpendicular to said X-direction, each of the second elongated piezoelectric stack means having a first and second end, a plurality of clamping piezoelectric stack means extending in a Z-direction mutually perpendicular to the X-direction and the Y-direction and being coupled to the first ends of the first and the second elongated piezoelectric stack means, and means for coupling together the X-direction drive section and the Y-direction drive section.

BRIEF DESCRIPTION OF THE DRAWINGS

The manner in which the above objects and other objects, features, and advantages of the present invention are attained will become more apparent from the following detailed description when considered in view of the drawings, wherein.

DETAILED DESCRIPTION

Figure 1:
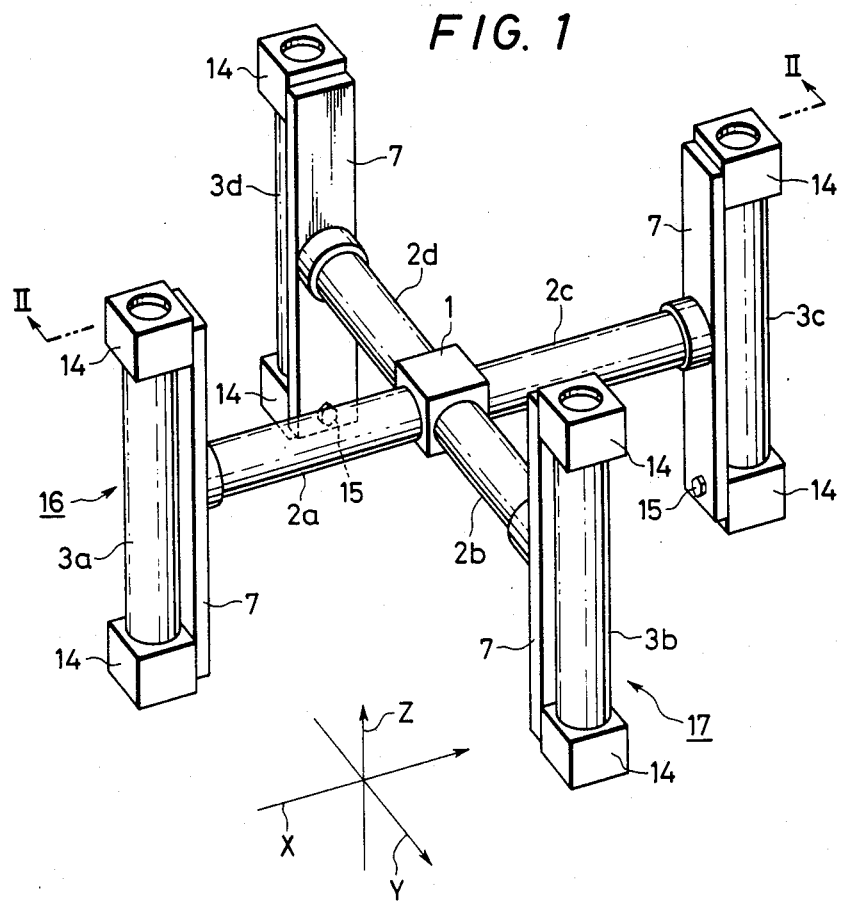
FIG. 1 is an illustration of a first embodiment of a piezoelectric scanning device according to the present invention.

A first embodiment of the present invention will be described with reference to FIGS. 1 through 3.

In these figures, reference numeral 1 designates a central block of metal. Straight-advancing, i.e., elongated, piezoelectric stacks, 2a, 2b, 2c and 2d extend radially from four sides of the central block 1. Clamping piezoelectric stacks 3a, 3b, 3c, and 3d are coupled to the outer ends of the elongated piezoelectric stacks 2a, 2b, 2c, and 2d, respectively.

Figure 3:
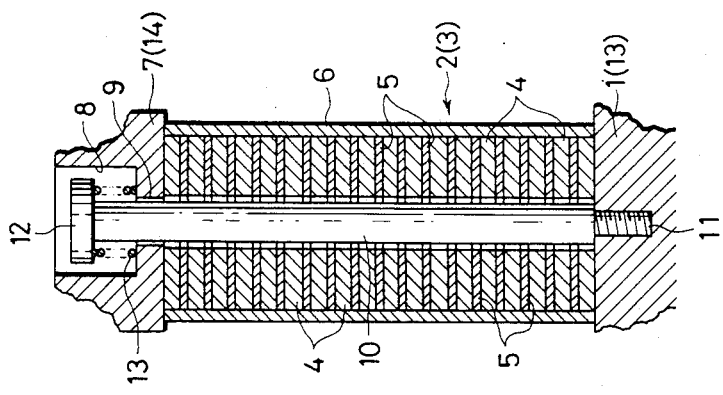
FIG. 3 is an enlarged view of a portion of the cross section of FIG. 2.

Each elongated piezoelectric stack 2a, 2b, 2c, and 2d and clamping piezoelectric stack 3a, 3b, 3c, and 3d is formed as shown in FIG. 3. Annular piezoelectric plates 4 are laminated with electrode plates 5 to form a piezoelectric stack. An outer cylindrical wall of the piezoelectric stack is covered with a flexible cover 6. The piezoelectric plates 4 are electrically connected in parallel to one another. Therefore, when a voltage is applied to the electrode plates 5, the piezoelectric plates 4 are expanded in the same direction. As a result, the end of the piezoelectric stack is slightly moved, about 30 u for instance.

One end of each elongated piezoelectric stack is connected to a connecting plate 7, and the other end is connected to the central block 1 as was described before. That is, a connecting rod 10 having a threaded portion 11 at one end is inserted into a through-hole 9 formed in a recess 8 of the connecting plate 7 and through the central holes of the piezoelectric plates 4. The threaded portion 11 is screwed into the central block 1.

The connecting rod 10 has a flange 12 at the other end. The flange 12 is placed in the recess 8. One or more springs 13 is interposed between the flange 12 and the bottom of the recess 8 so that the piezoelectric plates 4 are pushed against one another by the spring 13. Therefore, the linear expansion of the elongated piezoelectric stacks 2a, 2b, 2c, and 2d are permitted by a compression of the spring 13.

The coupling means of each clamping piezoelectric stack is substantially the same as that of the above-described elongated piezoelectric laminate. However, each clamping piezoelectric stack differs from the elongated piezoelectric stacks in that instead of the central block 1 and the coupling plate 7, clamp plates 14 abutting against walls W are provided on the top and bottom of each of the clamping piezoelectric laminates.

The coupling plate 7 of each elongated piezoelectric stack 2 is secured, at one end, to one clamp plate 14 (the lower clamp plate in FIG. 2) with a screw 15 in such a manner that the coupling plate 7 contacts the sides of the upper and lower clamp plates 14. Thus, the elongated piezoelectric stacks are connected to the clamping piezoelectric stacks.

Figure 2:
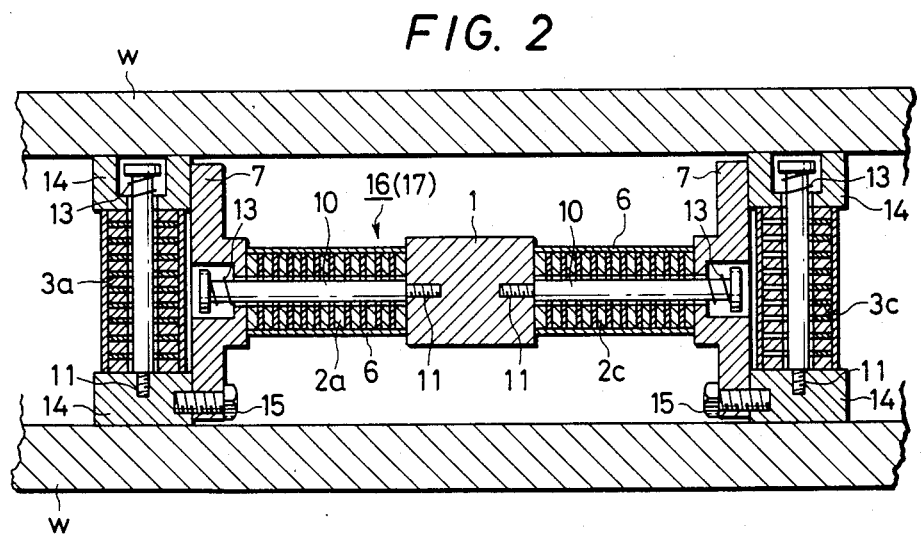
FIG. 2 is a cross section of the scanning device of FIG. 1 along the line II—II.

In FIG. 1, the elongated piezoelectric stacks 2a and 2c and the clamping piezoelectric stacks 3a and 3c, which are arranged in the X-direction, from an X-direction drive section 16. Similarly, the elongated piezoelectric stacks 2b and 2d and the clamping piezoelectric stacks 3b and 3c, which are arranged in the Y-direction, form a Y-direction drive device 17.

Each piezoelectric stack is made up of a number of piezoelectric plates, as stated above, which are parallel-connected as shown in FIG. 3. Therefore, upon application of a voltage to the piezoelectric plates, the piezoelectric stack is expanded or contracted.

The piezoelectric scanning device is designed to be set between two parallel walls that are confronted with each other in the Z-direction. When it is required to move the device in the X-direction, one of the clamping piezoelectric stacks of the X-direction drive section is expanded so as to abut firmly against the walls W, and under this condition a voltage is applied to the elongated piezoelectric stacks in the X-direction to expand the latter. As a result, the other clamping piezoelectric stack is slightly moved away from the first clamping piezoelectric stack. Next, the other clamping piezoelectric stack is energized to expand and abut against the two walls W. Under this condition, the application of a voltage to the first clamping piezoelectric stack is ended and the elongated piezoelectric stacks in the X-direction drive are restored. As a result, the first clamping piezoelectric stack is slightly moved with the other clamping piezoelectric stack as a base point. In this manner, the X-direction drive section has moved one step. The piezoelectric scanning device is moved in the X-direction by repeatedly carrying out the above-described stepping operation.

The piezoelectric scanning device can be moved in the Y-direction by controlling the elongated piezoelectric stacks and the clamping piezoelectric stacks with voltages in the same manner as that in the above-described case where the device is moved in the X-direction.

The course and direction of movement of the piezoelectric scanning device can, thus, be freely determined by controlling the stepping operations of the X-direction drive section and the Y-direction drive section.

The operation of the piezoelectric scanning device of the present invention constructed in accordance with the first embodiment will now be described.

In the case where the piezoelectric scanning device is moved in the X-direction, the clamping piezoelectric stack 3a expands to cause its clamp plates 14 to abut against the walls W. Under this condition, the elongated piezoelectric stacks 2a and 2c are expanded so as to move the clamping piezoelectric stack 3c. The clamping piezoelectric stack 3a is released, and a voltage is applied to the clamping piezoelectric stack 3c to expand the latter so that its clamp plates 14 abut against the walls W, i.e., the clamping piezoelectric stack 3c is clamped by the two walls W.

Under this condition, a voltage is applied to the elongated piezoelectric stacks 2a and 2c, so that the latter are contracted with the clamping piezoelectric stack 3c as a base point. As a result of these actions, the X-direction drive section 16 has moved one step.

The piezoelectric scanning device is moved in the X-direction by repeatedly carrying out this stepping operation. In the movement described above, the clamping piezoelectric stacks 3b and 3d of the Y-direction drive section 17 are maintained contracted so that the Y-direction drive section follows the movement of the central block 1.

In order to move the piezoelectric scanning device in the Y-direction, the Y-direction drive section is operated in the same manner as the X-direction drive section.

Figure 4:
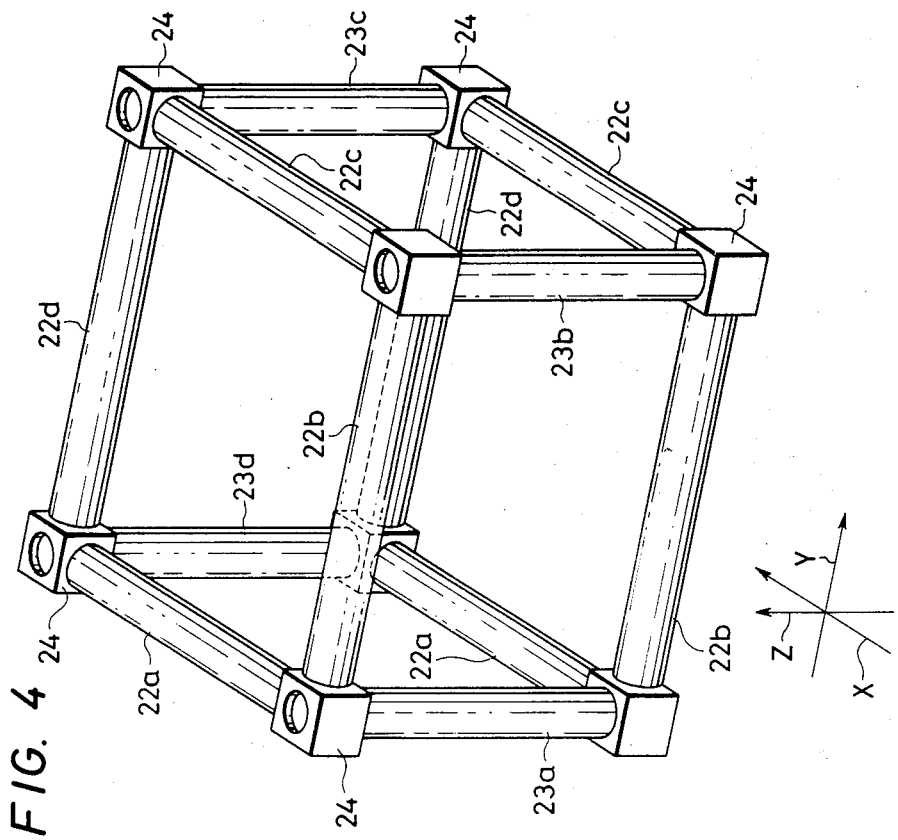
FIG. 4 is an illustration of a second embodiment of the piezoelectric scanning device of the present invention.

FIG. 4 shows a second embodiment of the present invention. An upper square is formed by connecting elongated piezoelectric stacks 22a, 22b, 22c, and 22d through four connecting blocks 24. A lower square is formed in the same manner. With the two squares thus formed placed one above the other, the coupling blocks 24 of the upper square are connected to the blocks 24 of the lower square through clamping piezoelectric stacks 23a, 23b, 23c, and 23d, which are equal in length, as shown in FIG. 4. Thus, a cube has been formed from the piezoelectric stacks.

In the piezoelectric scanning device of FIG. 4, the upper elongated piezoelectric stacks 22a and 22c, the lower elongated piezoelectric stacks 22a and 22c, and the clamping piezoelectric stacks 23a through 23d form an X-direction drive unit. Similarly, the upper elongated piezoelectric stacks 22b and 22d, the lower elongated piezoelectric stacks 22b and 22d, and the clamping piezoelectric stacks 23a through 23d form a Y-direction drive unit.

The operation of the piezoelectric scanning device of FIG. 4 will now be described.

In the case where it is required to move the device in the X-direction, the clamping piezoelectric stacks 23a and 23b are expanded to be clamped by the walls W, and the elongated piezoelectric stacks 22a and 22c are also expanded. This causes the elongated piezoelectric stacks 22b and 22d and the clamping piezoelectric laminates 23c and 23d to move in the X-direction. Next, the clamping piezoelectric stacks 23c and 23d are expanded so as to be clamped, and the clamping piezoelectric stacks 23a and 23b and the upper and lower elongated piezoelectric stacks 22a and 22c, which have been expanded, are released. The clamping piezoelectric stacks 23a and 23b are thereby moved towards the clamping piezoelectric stacks 23c and 23d which have been clamped by the walls W. That is, the X-direction drive unit is moved one step. The piezoelectric scanning device is moved in the X-direction by repeatedly carrying out the above-described stepping operations.

In the movement in the Y-direction, the elongated piezoelectric stacks 22b and 22d are expanded and contracted, and the clamping piezoelectric stacks 23a and 23d and the clamping piezoelectric stacks 23b and 23c are alternately clamped as in the movement in the X-direction.

As is apparent from the above description in the piezoelectric scanning device of the present invention, the X-direction drive section and the Y-direction drive section are formed by suitably combining the elongated piezoelectric stacks and the clamping piezoelectric stacks, and the movement of each of the drive sections is controlled so that the device is selectively moved in two dimensions. Therefore, the direction of movement of the device, and accordingly the locus thereof can be freely determined. Thus, the present invention can be highly appreciated in practical use as having an improved scanning function.

What is claimed is:

1. A piezoelectric electric scanning device comprising:
    four X-direction drive sections each including elongated piezoelectric stack means extending in the X-direction, each of said X-direction drive sections being parallel to each other;
    four Y-direction drive sections each including elongated piezoelectric stack means extending in the Y-direction perpendicular to said X-direction, each of said Y-direction drive sections being parallel to each other;
    four Z-direction clamping sections each including clamping piezoelectric stack means extending in the Z-direction mutually perpendicular to said X-direction and said Y-direction, each of said X- direction clamping sections being parallel to each other; and means for coupling said four X-direction drive sections, said four Y-direction drive sections and said four Z-direction clamping sections together, said coupled X-direction sections, said Y-direction sections and said Z-direction sections together defining the edges of a cube.

2. A piezoelectric scanning device according to claim 1, wherein said coupling means comprises a first plurality of coupling blocks and a second plurality of coupling blocks, each of said first coupling blocks being connected to a first end of each of said four X-direction drive sections, and to an end of one of said Y-direction drive sections, and to an end of one of said Z-direction clamping sections, and each of said second coupling blocks being connected to a second end of one of each of said X-direction drive sections opposite said first ends, and to an end of one of said Y-direction drive sections, and to an end of one of said Z-direction clamping sections.

3. A piezoelectric scanning device according to claim 2, wherein each of said X-direction drive sections and Y-direction drive sections comprise a plurality of annular piezoelectric plates alternately laminated with a plurality of electrode plates.

* * * * *